(12) United States Patent
Wang et al.

(10) Patent No.: US 12,068,757 B2
(45) Date of Patent: Aug. 20, 2024

(54) METHOD FOR PERFORMING LDPC SOFT DECODING, MEMORY, AND ELECTRONIC DEVICE

(71) Applicant: Institute of Microelectronics, Chinese Academy of Sciences, Beijing (CN)

(72) Inventors: Qi Wang, Beijing (CN); Yiyang Jiang, Beijing (CN); Qianhui Li, Beijing (CN); Zongliang Huo, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 15 days.

(21) Appl. No.: 17/907,048

(22) PCT Filed: Mar. 23, 2020

(86) PCT No.: PCT/CN2020/080577
§ 371 (c)(1),
(2) Date: Sep. 22, 2022

(87) PCT Pub. No.: WO2021/189177
PCT Pub. Date: Sep. 30, 2021

(65) Prior Publication Data
US 2023/0120804 A1    Apr. 20, 2023

(51) Int. Cl.
*H03M 13/11*      (2006.01)
*H03M 13/15*      (2006.01)
(Continued)

(52) U.S. Cl.
CPC ...... *H03M 13/1111* (2013.01); *H03M 13/154* (2013.01); *H03M 13/3927* (2013.01);
(Continued)

(58) Field of Classification Search
CPC .... G11C 29/52; G06F 11/00; H03M 13/1111; H03M 13/3927; H03M 13/45;
(Continued)

(56) References Cited

U.S. PATENT DOCUMENTS 9,397,701 B1    7/2016  Micheloni et al.
10,884,855 B1 *  1/2021  Yazovitsky ......... G11C 11/4074
(Continued)

FOREIGN PATENT DOCUMENTS

CN    101645295 A    2/2010
CN    104052498 A    9/2014
(Continued)

OTHER PUBLICATIONS

"Chinese Application Serial No. 202010210168.0, Office Action dated Mar. 31, 2022", w/ English Translation, (Mar. 31, 2022), 20 pgs.
(Continued)

*Primary Examiner* — April Y Blair
*Assistant Examiner* — Sazzad Hossain
(74) *Attorney, Agent, or Firm* — Schwegman Lundberg & Woessner, P.A.

(57) ABSTRACT

The method includes: reading a memory cell having a encoded information bit, so as to obtain an LLR value of a current memory cell with reference to a pre-established LLR table according to a storage time, a threshold voltage partition and a comprehensive distribution corresponding to the current memory cell during reading; and performing a soft decoding operation on a codeword in the memory cell having the encoded information bit according to the read LLR value of the current memory cell, wherein the comprehensive distribution of the current memory cell is determined according to an influence of a memory cell adjacent to the current memory cell on a distribution of the current memory cell; an input of the pre-established LLR table
(Continued)

comprises a storage time, a threshold voltage partition and a comprehensive distribution, and an output of the pre-established LLR table comprises an LLR value.

13 Claims, 8 Drawing Sheets

(51) Int. Cl.
*H03M 13/39* (2006.01)
*G06F 11/00* (2006.01)
*G11C 29/52* (2006.01)
*H03M 13/25* (2006.01)
*H03M 13/29* (2006.01)
*H03M 13/37* (2006.01)
*H03M 13/45* (2006.01)

(52) U.S. Cl.
CPC ............... *G06F 11/00* (2013.01); *G11C 29/52* (2013.01); *H03M 13/1108* (2013.01); *H03M 13/255* (2013.01); *H03M 13/2948* (2013.01); *H03M 13/3746* (2013.01); *H03M 13/45* (2013.01)

(58) Field of Classification Search
CPC ........... H03M 13/154; H03M 13/2948; H03M 13/3746; H03M 13/255; H03M 13/1108
See application file for complete search history.

(56) References Cited

U.S. PATENT DOCUMENTS

| | | | |
|---|---|---|---|
| 2009/0154236 A1 | 6/2009 | Kozlov | |
| 2014/0281800 A1* | 9/2014 | Micheloni | H03M 13/255 714/759 |
| 2014/0281822 A1 | 9/2014 | Wu et al. | |
| 2015/0365106 A1 | 12/2015 | Wu et al. | |
| 2017/0269995 A1* | 9/2017 | Maffeis | H03M 13/1105 |
| 2018/0076832 A1* | 3/2018 | Haga | G11C 11/5642 |

FOREIGN PATENT DOCUMENTS

| | | |
|---|---|---|
| CN | 108777157 A | 11/2018 |
| CN | 109887537 A | 6/2019 |
| CN | 110535476 A | 12/2019 |
| CN | 111429959 A | 7/2020 |

OTHER PUBLICATIONS

"Chinese Application Serial No. 202010210168.0, Office Action dated Sep. 3, 2021", w/ English Translation, (Sep. 3, 2021), 24 pgs.

"International Application Serial No. PCT/CN2020/080577, International Search Report dated Nov. 30, 2020", (Nov. 30, 2020), 5 pgs.

"International Application Serial No. PCT/CN2020/080577, Written Opinion dated Nov. 30, 2020", (Nov. 30, 2020), 4 pgs.

* cited by examiner

METHOD FOR PERFORMING LDPC SOFT DECODING, MEMORY, AND ELECTRONIC DEVICE

PRIORITY APPLICATIONS

This application is a U.S. National Stage Filing under 35 U.S.C. § 371 from International Application No. PCT/CN2020/080577, filed on Mar. 23, 2020, and published as WO2021/189177 on Sep. 30, 2021; the benefit of priority of which is hereby claimed herein, and which application and publication are hereby incorporated herein by reference in their entirety.

TECHNICAL FIELD

The present disclosure relates to a field of encoding and decoding technology for a memory, in particular to a method for performing a low density parity check (LDPC) soft decoding, a memory and an electronic device, and specifically to a method for performing an LDPC soft decoding used for a memory in which an adjacent memory cell have an influence on a distribution of a current memory cell, a memory and an electronic device.

BACKGROUND

Non-volatile memories are of various types, such as: a read-only memory (ROM), a programmable read-only memory (PROM), an electrically-alterable read-only memory (EAROM), an erasable programmable read-only memory (EPROM), an electrically erasable programmable read-only memory (EEPROM), a flash memory, and the like. Data needs to be encoded and the encoded data needs to be written into a memory cell of a memory array when the nonvolatile memory store information, and a decoding operation needs to be performed when the data is read.

When an existing non-volatile memory uses an LDPC soft decoding, in general, for a single-level cell (SLC) flash memory, two distributions are distributed along a threshold voltage, an overlap exists between the two distributions, data is read 3 times at each overlap, and read data is distributed along the threshold voltage and divided into 4 blocks. Different regions correspond to different log likelihood ration (LLR) values. The expression of LLR is as follows: $LLR=Log(P_0/P_1)$, where $P_0$ represents a probability of logic 0, and $P_1$ represents a probability of logic 1. Different LLR values reflect different confidence levels and reliability. The higher an LLR value, the higher a probability that the read data in the region is 0. The above-mentioned method for performing an LDPC soft decoding is also applicable to a multi-level cell (MLC) flash memory and a triple-level cell (TLC) flash memory. The two flash memories differ in that the MLC has $2^2=4$ distributions distributed along a threshold voltage distribution, while the TLC has $2^3=8$ distributions distributed along the threshold voltage distribution. However, an existing LDPC soft decoding still need to improve an error correction capability of an LDPC soft decoding, and reduce a bit error rate and the number of iteration times.

SUMMARY

The present disclosure provides a method for performing an LDPC soft decoding, a memory and an electronic device, and in particular, a method for performing an LDPC soft decoding for a memory in which adjacent memory cells have an influence on a distribution of a current memory cell, a memory and an electronic device.

According to an aspect of the present disclosure, there is provided a method for performing an LDPC soft decoding used for a memory including a plurality of memory cells, the method including:

reading a memory cell having a encoded information bit, so as to obtain an LLR value of a current memory cell with reference to a pre-established LLR table according to a storage time, a threshold voltage partition and a comprehensive distribution corresponding to the current memory cell during reading; and performing a soft decoding operation on a codeword in the memory cell having the encoded information bit according to the read LLR value of the current memory cell;

wherein the comprehensive distribution of the current memory cell is determined according to an influence of a memory cell adjacent to the current memory cell on a distribution of the current memory cell; an input of the pre-established LLR table includes a storage time, a threshold voltage partition and a comprehensive distribution, and an output of the pre-established LLR table includes an LLR value.

In an embodiment of the present disclosure, the method further includes: before the reading a memory cell having a encoded information bit encoding the information bit to obtain the codeword and writing the codeword into the memory cell of the memory.

In an embodiment of the present disclosure, the LLR table is pre-established by: performing a reading test on the memory, acquiring respective threshold voltage partitions and distributions of a current memory cell having a known accurate encoding and a memory cell adjacent to the current memory cell at a certain memory time, determining a comprehensive distribution of the current memory cell according to an influence of the memory cell adjacent to the current memory cell on a distribution of the current memory cell, and calculating LLR values for different threshold voltage partitions according to the comprehensive distribution; and acquiring corresponding threshold voltage partitions and comprehensive distributions under different storage time, so as to obtain the LLR table with the storage time, the threshold voltage partition and the comprehensive distribution as the input and the LLR value as the output.

In an embodiment of the present disclosure, the memory is a 3D NAND flash memory, the current memory cell has a corresponding coordinate of (m, n, k), k≥1, and the memory cell adjacent to the current memory cell is selected by: sequentially selecting, upwardly and/or downwardly along a z-axis, a plurality of memory cells with a preset distance from the current memory cell.

In an embodiment of the present disclosure, at least two adjacent physical pages including a physical page where the current memory cell is located are read in response to determining the comprehensive distribution of the current memory cell.

In an embodiment of the present disclosure, only two levels of physical pages are selected for a read operation in response to determining the comprehensive distribution of the current memory cell, wherein a physical page at a low level is a physical page where the current memory cell is located, and a physical page at a high level is a physical page where the memory cell adjacent to the current memory cell is located, and the comprehensive distribution of the current memory cell is determined by reading a distribution of the memory cell on the two levels of physical pages.

In an embodiment of the present disclosure, the input in the LLR table further includes: a number of erasing times.

According to another aspect of the present disclosure, there is provided a memory including a plurality of memory cells, and the memory is configured to perform a method of any of the above-mentioned methods.

In an embodiment of the present disclosure, the memory includes a flash memory.

According to still another aspect of the present disclosure, there is provided an electronic device including: an encoding unit configured to encode an information bit to obtain a codeword and write the codeword into a memory cell of a memory; an LLR memory cell configured to store a pre-established LLR table, wherein an input of the LLR table includes: a storage time, a threshold voltage partition and a comprehensive distribution, and an output of the LLR table includes an LLR value; wherein the comprehensive distribution of a current memory cell is determined according to an influence of a memory cell adjacent to the current memory cell on a distribution of the current memory cell; a reading unit configured to read the memory cell having a encoded information bit, and extract the pre-established LLR table from the LLR memory cell, so as to obtain an LLR value of the current memory cell according to the storage time, the threshold voltage partition and the comprehensive distribution corresponding to the current memory cell during reading; and a decoding unit configured to perform a soft decoding operation on the codeword in the memory cell having the encoded information bit according to the read LLR value of the current memory unit.

In an embodiment of the present disclosure, the electronic device includes: a computer, a mobile phone, a smart sound, a wearable smart device and a robot.

In an embodiment of the present disclosure, the electronic device and a memory with data writing and decoding are two independent individuals; or the memory with data writing and decoding serves a component of the electronic device.

In an embodiment of the present disclosure, the LLR memory cell is located within the memory, within the electronic device, or on a server.

Figure 1:
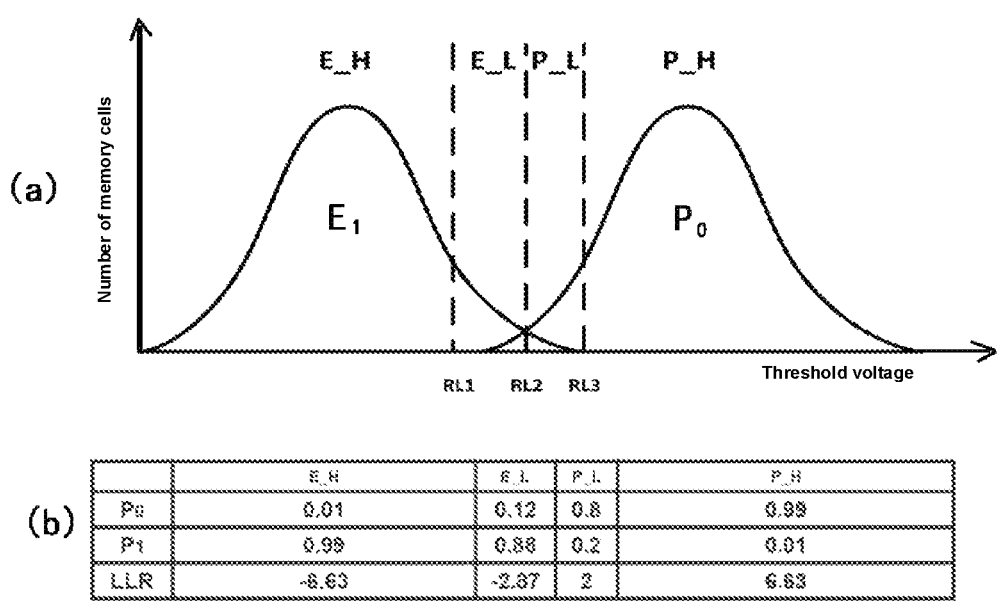
FIG. 1 shows an example of calculating an LLR for a read data division region by using an LDPC soft decoding in the prior art, where (a) shows a schematic diagram of the read data division region, and (b) shows an example of calculating LLRs for different regions.

DESCRIPTION OF SYMBOLS an electronic device 3;
an LLR memory cell 31;
an encoding unit 32;
a reading unit 33;
a decoding unit 34.

DETAILED DESCRIPTION OF EMBODIMENTS

The present disclosure provides a method for performing an LDPC soft decoding and a memory. Considering that adjacent memory cells have an influence on a distribution of a current memory cell, such as a lateral spreading effect or a capacitive coupling effect, a comprehensive distribution is proposed to represent a form of the distribution of the current memory cell based on an influence effect of the adjacent memory cell, and a decoding operation is performed based on an LLR value determined in each partition by the comprehensive distribution. Further, the performing a decoding operation based on an LLR value obtained in each partition by the comprehensive distribution in the present disclosure may reduce a bit error rate and achieve a higher error correction capability.

In order to make the objects, technical solutions and advantages of the present disclosure more apparent, the present disclosure will be further described in detail below in conjunction with specific embodiments and with reference to the accompanying drawings. In the present disclosure, the term "soft decoding" denotes a belief propagation algorithm. The belief propagation algorithm is an iterative decoding algorithm based on a Tanner graph. In an iteration process, reliability information, that is, "message", is transmitted back and forth between a variable node and a check node through an edge on the Tanner graph. Values tend to be stable after a plurality of iterations, and then an optimal judgment is made according to the stable values.

Taking a flash memory as an example, FIG. 1 shows an example of calculating an LLR for a read data division region by using an LDPC soft decoding in the prior art, where (a) shows a schematic diagram of the read data division region, and (b) shows an example of calculating LLRs for different regions. Referring to FIG. 1, a state of the memory cell is read by an LDPC soft decoding in an existing NAND flash memory. For example, for a single-level cell (SLC), a physical page corresponds to a logical page, and for a certain memory cell, the read data has two distributions continuously distributed with a threshold voltage, which are represented by $E_1$ and $P_0$ respectively. The distribution $E_1$ corresponds to a high probability of logic 1, and the distribution $P_0$ corresponds to a high probability of logic 0. When an LDPC encoding is performed, a threshold voltage corresponding to an intersection between the two distributions $E_1$ and $P_0$ serves as a boundary RL2, and two other boundaries RL1 and RL3 may be obtained along a preset distance from the left and right of the boundary RL2. In this way, the read data may be divided into 4 regions by the three boundaries RL1, RL2 and RL3. Referring to (a) of FIG. 1, the 4 regions are represented by E_H, E_L, P_L and P_H. Referring to (b) of FIG. 1, the LLR value may be calculated in each region. In the region E_H, a probability $P_0$ of logic 0 is 0.01 and a probability $P_1$ of logic 1 is 0.99, so that the LLR value for the region E_H is calculated to be −6.63, which indicates that 1 may be read out in the region E_H with a high probability. In the region E_L, the probability $P_0$ of logic 0 is 0.12 and the probability $P_1$ of logic 1 is 0.88, so that the LLR value for the region E_L is calculated to be −2.87, which indicates that 1 may be read out in the region E_L with a high probability. However, a probability value of reading out 1 in the region E_L is smaller than that of reading out 1 in the region E_H. Similarly, the LLR values for the regions P_L and P_H are respectively: 2 and 6.63, which indicates that 0 may be read out in the regions P_L and P_H with a high probability. However, a probability value of reading out 0 in the region P_H is greater than that of reading out 0 in the region P_L. The above-mentioned decoding method still has a certain bit error rate, and particularly has a higher error probability near an overlapping region of two distributions.

Considering a presence of a lateral spreading effect in the 3D NAND flash memory, that is, information stored in the adjacent memory cells on the same channel may have a great influence on a storage performance of the current memory cell. The present disclosure proposes the use of a comprehensive distribution to represent a form of the distribution of the current memory cell. An LLR value is configured according to the comprehensive distribution considering the influence of distributions of the adjacent memory cells in each partition, and a decoding operation is performed according to the LLR value. Certainly, the method for performing an LDPC soft decoding proposed based on the above-mentioned technical concept is not limited to the 3D NAND flash memory, nor to a mutual influence of the adjacent memory cells caused by the lateral spreading effect. As long as a plurality of memory cells are provided and a mutual influence effect exists between the plurality of memory cells, memories in which a distribution of a certain memory cell is influenced are all applicable to the soft decoding method of the present disclosure, and the method of the present disclosure has a greater advantage compared with that in the prior art.

The present disclosure proposes a new method for configuring an LLR by LDPC soft decoding. Based on a consideration of an environment where the memory unit is located, a comprehensive distribution of the current memory unit may be obtained by considering an influence of the memory unit near the current memory unit on the distribution of the current memory unit, and a decoding operation is performed based on an LLR value is determined in each partition by the comprehensive distribution. The above-mentioned comprehensive distribution covers an actual state of the current memory unit, and provides a more accurate and comprehensive reference value.

Other memory cells in an environment where a certain memory cell is located have an influence on the memory cell, but a magnitude of the influence varies. From the perspective of accurately calculating an LLR, as many memory cells as possible may be selected in a surrounding environment of the current memory cell, so as to make an influence of surrounding memory cells as accurate as possible. However, an acquisition of the comprehensive distribution by the method needs a huge of number of other determined memory cells and a high time cost and read operation cost. In an embodiment, considering the magnitude of the influence of other memory cells in the environment where a certain memory cell is located on the distribution of the memory cell may be considered, the memory cell with a dominant influence may be selected to obtain the comprehensive distribution of the current memory cell, so that a balance between an accuracy and a cost may be achieved.

In some memory structures, such as two-dimensional or three-dimensional (2D or 3D) flash memory, the memory has a plurality of memory cells, and the plurality of memory cells form a two-dimensional or three-dimensional memory array. Several memory cells may be provided around a memory cell inside the two-dimensional or three-dimensional memory array or a memory cell on an edge of the two-dimensional or three-dimensional memory array, and the memory cell near the current memory cell may affect the distribution of the current memory cell. For example, in the 3D NAND flash memory, a distribution of a certain memory cell may be affected between adjacent memory cells located on the same channel due to a presence of the lateral spreading effect. Alternatively, in some memory structures, a capacitive coupling may exist between the adjacent memory cells. Certainly, in the whole text, the method of the present disclosure is applicable to a case where the distribution of the current memory cell may be affected by a presence of other memory cells near the current memory cell, and a principle of the effect may be a lateral spreading effect or other effects.

Taking a flash memory as an example, since the flash memory uses a design of a shared charge storage space, information stored in the adjacent memory cells on the same channel has a great influence on a storage performance of the current memory cell, and an LLR value is configured in each partition according to the comprehensive distribution considering the influence of the distribution of the adjacent memory cells.

In a first exemplary embodiment of the present disclosure, there is provided a method for performing an LDPC soft decoding.

Figure 2:
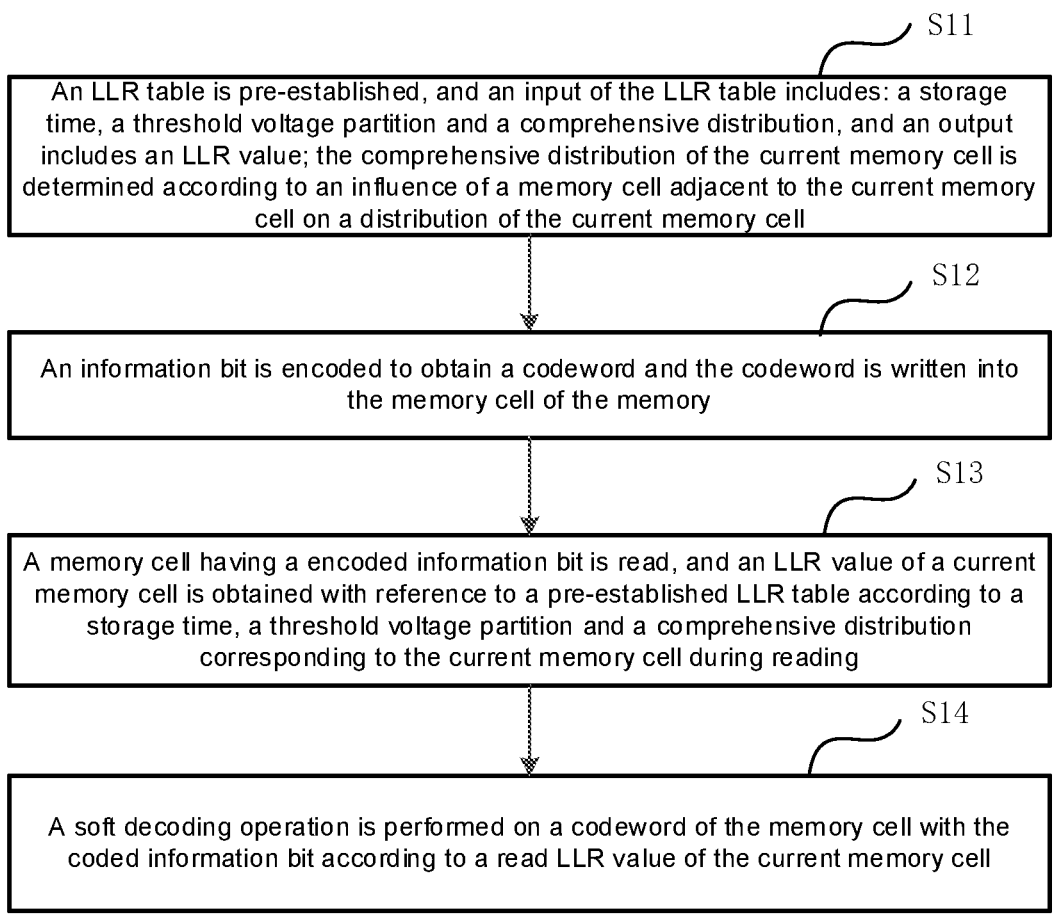
FIG. 2 shows a flowchart of a method for performing an LDPC soft decoding according to an embodiment of the present disclosure.

FIG. 2 shows a flowchart of a method for performing an LDPC soft decoding according to an embodiment of the present disclosure.

Referring to FIG. 2, the method for performing an LDPC soft decoding of this embodiment includes step S11, step S13 and step S14.

In the step S11, an LLR table is pre-established, an input of the LLR table includes: a storage time, a threshold voltage partition and a comprehensive distribution, and an output includes an LLR value. The comprehensive distribution of the current memory cell is determined according to an influence of a memory cell adjacent to the current memory cell on a distribution of the current memory cell.

The storage time is the time for storing data in the memory, and the storage time may be calculated by subtracting the time corresponding to encoded data from the time corresponding to a decoding.

The threshold voltage partition and the comprehensive distribution are functions of the storage time, and the threshold voltage partition and the comprehensive distribution may change with a change in the storage time.

In an embodiment of the present disclosure, the LLR table is pre-established by: performing a reading test on the memory, acquiring respective threshold voltage partitions and distributions of a current memory cell having a known accurate encoding and a memory cell adjacent to the current memory cell at a certain memory time, determining a comprehensive distribution of the current memory cell according to an influence of the memory cell adjacent to the current memory cell on a distribution of the current memory cell, and calculating LLR values for different threshold voltage partitions according to the comprehensive distribution; and acquiring corresponding threshold voltage partitions and comprehensive distributions under different storage time, so as to obtain the LLR table with the storage time, the threshold voltage partition and the comprehensive distribution as the input and the LLR value as the output.

In the step S11, the LLR table may be established by pre-experiment. For example, a process of the pre-experiment includes: selecting a random number A, storing the random number A in a flash memory and then baking the random number A at certain time interval to obtain data (threshold voltages) of A1, A2, and the like; then determining the comprehensive distribution of each memory cell according to data in the A, classifying the memory cell according to a determination result, and counting the threshold voltages of each type of comprehensive distribution unit; and finally, calculating LLR values corresponding to different distributions at different times according to partitions, and recording the LLR values in a table.

In an embodiment of the present disclosure, at least two adjacent physical pages including a physical page where the current memory cell is located are read in response to determining the comprehensive distribution of the current memory cell.

In an embodiment of the present disclosure, only two levels of physical pages are selected for a read operation in response to determining the comprehensive distribution of the current memory cell, a physical page at a low level is a physical page where the current memory cell is located, and a physical page at a high level is a physical page where the memory cell adjacent to the current memory cell is located, and the comprehensive distribution of the current memory cell is determined by reading the distribution of the memory cell on the two levels of physical pages.

In an embodiment of the present disclosure, in the LLR table, the input further includes: a number of erasing times.

In the step S13, a memory cell having a encoded information bit is read, and an LLR value of a current memory cell is acquired from a pre-established LLR table according to a storage time, a threshold voltage partition and a comprehensive distribution corresponding to the current memory cell during reading.

In the step S14, a soft decoding operation is performed on a codeword in the memory cell having the encoded information bit according to a read LLR value of the current memory cell.

In an embodiment, the present disclosure may further include step S12. The step S12 is executed before the step S13. In the step S12, an information bit is encoded to obtain a codeword, and the codeword is written into the memory cell of the memory.

In an embodiment, for the 3D NAND flash memory, in the step S11 of establishing the LLR table, the input further includes: a number of times of programming and erasing (P/E cycle).

The embodiments of the above steps will be described in detail below with reference to the accompanying drawings.

Figure 3:
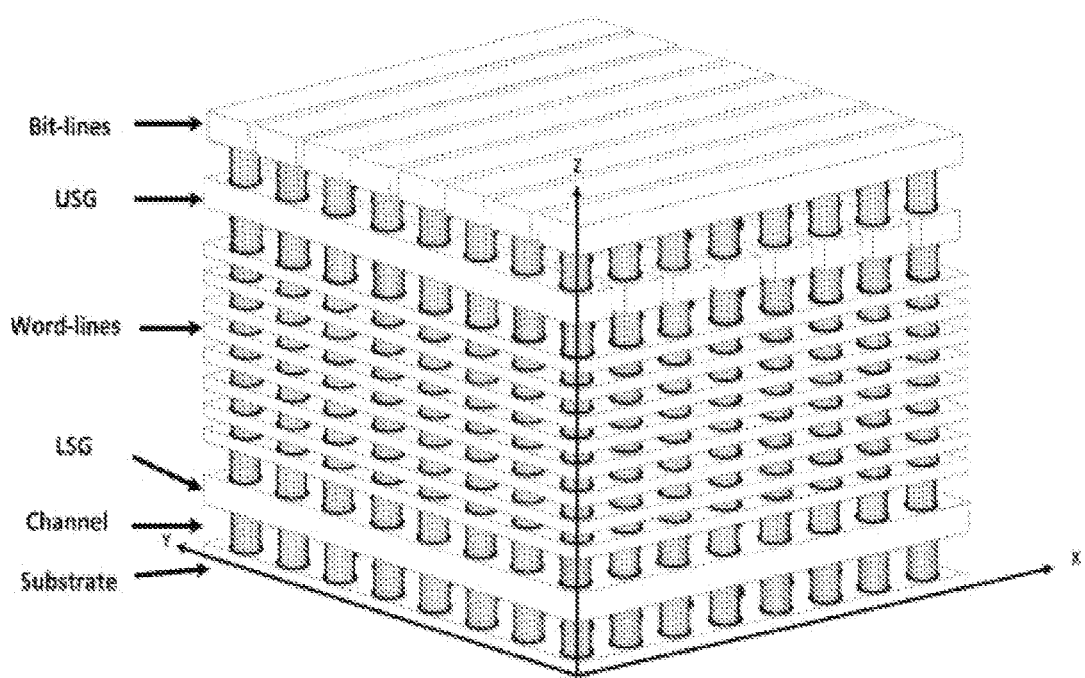
FIG. 3 shows a schematic structural diagram of a flash memory according to the embodiments of the present disclosure.

A basic process when a reading operation is performed by a non-volatile memory will be exemplarily described with a structure corresponding to the flash memory with reference to FIG. 3.

FIG. 3 shows a schematic structural diagram of a flash memory according to embodiments of the present disclosure. Referring to FIG. 3, a 3D charge trap type NAND Flash block is illustrated, a memory cell array corresponding to each level is a physical page, and the adjacent memory cells on the same channel have the same x and y coordinates and different z coordinates, that is, the adjacent memory cells on the same channel are located in different physical pages. In the SLC, MLC and TLC, the following relationship exists between physical and logical pages: physical page=i× logical page, where i=1 for the SLC, i=2 for the MLC, and i=3 for the TLC. Therefore, in the related art, when a binary coding is used, the SLC has $2^1=2$ distributions, the MLC has $2^2=4$ distributions, and the TLC has $2^3=8$ distributions. During a process of reading the memory cell array, each physical level may be sequentially read from bottom to top according to a word-line (WL). Three adjacent physical levels in the present disclosure are respectively described as: a lower physical page, a middle physical page and an upper physical page, in a direction (i.e., z-direction) in which the word-line extends.

In the step S11, the comprehensive distribution of the current memory cell is determined according to an influence of a memory cell adjacent to the current memory cell on a distribution of the current memory cell. The "memory cell adjacent to the current memory cell" here has a meaning of: memory cells in a surrounding environment radiated from the current storage cell as a starting point, including a memory cell (which is not separated from other memory cells) adjacent to, a memory cell sub-adjacent to, a memory cell second-sub-adjacent to the current memory cell, etc.

Corresponding to different memory structures, the memory cell adjacent to the current memory cell may have various arrangements. For example, for the 3D NAND flash memory, the memory cell adjacent to the memory cell on a certain physical page refers to: a memory unit located on the same channel as the memory unit on a physical page adjacent to the above-mentioned physical page. Due to a presence of a better electrical isolation performance between memory cells on the same physical page, it may be considered that other memory cells on the same physical page have no influence on the current memory cell. When the comprehensive distribution is determined, a memory cell spatially adjacent to the current memory cell but having substantially no influence on the current memory cell is not included, or an influence of the memory cell is recorded as 0.

Referring to FIG. 3, in the 3D NAND flash memory, a word-line WL (n) corresponds to a physical page in which the current memory cell is located, where n is a positive integer. When n≥1, word-lines corresponding to the physical page in which the memory cell adjacent to the current memory cell is located may be: WL (n+1), WL (n+2), . . . ; when n≥2, the word-lines corresponding to the physical page in which the memory cell adjacent to the current memory cell is located may be: WL (n−1), WL (n+1) and WL (n+2) . . . . According to a position of the current memory cell, the adjacent memory cells may be obtained in a direction radiated from a single direction or a plurality (2 or more than 2) of directions, and an adjacent distance (i.e., the number or a level of adjacent memory cells to be selected) may be set according to an efficiency, a cost and an accuracy of an actual calculation. For example, when n=2, the word-lines corresponding to the physical page in which the memory cell adjacent to the current memory cell is located may be WL (1), WL (3), WL (4), or WL (1), WL (3), WL (4), WL (5).

In other exemplary examples, for example, for a 2D flash memory, a plurality of memory single-levels are arranged in a grid-like array. The current memory cell is located at the center, and the adjacent memory cells may be 8 memory cells surrounding the memory cell located at the center, or 4 memory cells in the same line as the memory cell located at the center. Alternatively, the adjacent memory cells may be obtained by selecting a larger range or a larger number of memory cells. In addition, the above-mentioned adjacent memory cells may, according to a distance from each adjacent memory cell to the current memory cell from the near to the distant, be divided into: a first adjacent memory cell, a second adjacent memory cell, . . . , the k-th adjacent memory cell, where k is a positive integer. The above-mentioned adjacent memory cells have a similar arrangement to the memory cell (which is not separated from other memory cells) adjacent to, the memory cell sub-adjacent to, and the memory cell second-sub-adjacent to the current memory cell described above.

Next, taking a triple-level cell TLC as an example, a corresponding relationship between different memory states and binary gray codes will be described below with reference to FIG. 6.

Figures 6, 7:
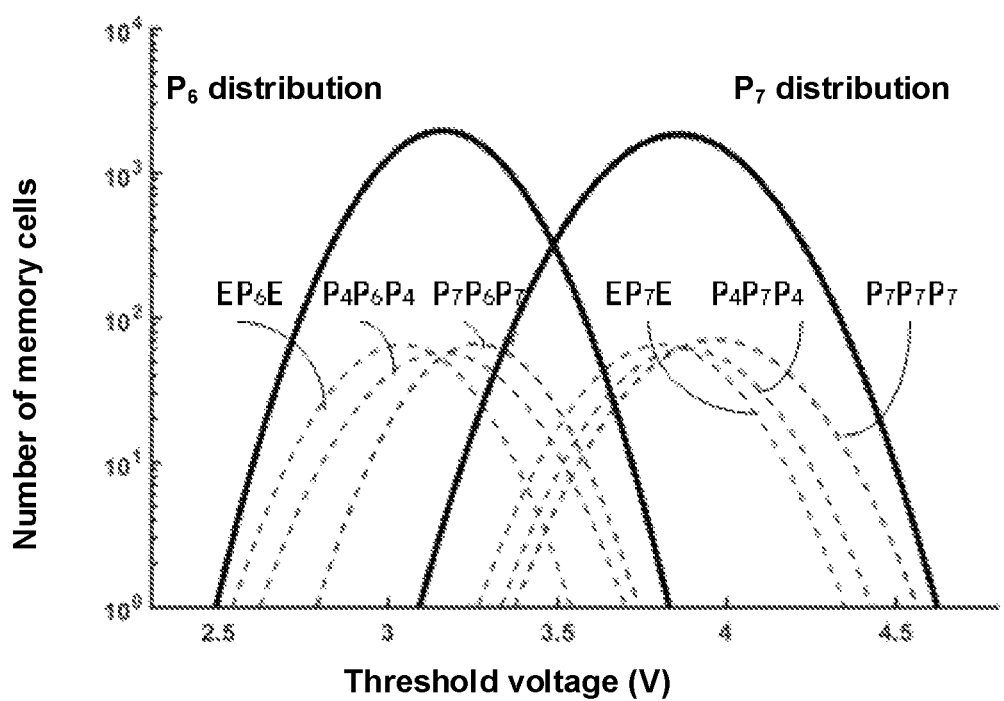
FIG. 6 shows a corresponding relationship between a state of a TLC flash memory and a binary gray code according to the embodiments of the present disclosure.
FIG. 7 shows a schematic diagram of dividing a comprehensive distribution of a memory unit into three types according to the embodiments of the present disclosure.

FIG. 6 shows a corresponding relationship between a state of a TLC flash memory and a binary gray code according to embodiments of the present disclosure. Referring to FIG. 6, each physical page has 8 distributions. The 8 distributions are represented by E, $P_1$, $P_2$, $P_3$, $P_4$, $P_5$, $P_6$ and $P_7$ in FIG. 6. In the lower physical page, gray codes corresponding to the 8 distributions are sequentially: 1 0 0 0 0 1 1 1. The double-sided arrows shown in FIG. 6 indicate that the gray codes may be exchanged. Similarly, in the middle physical page, the gray codes corresponding to the 8 distributions are sequentially: 1 1 0 0 1 1 0 0, and in the upper physical page, the gray codes corresponding to the 8 distributions are sequentially: 1 1 1 0 0 0 0 1.

In an example of implementing the step S12, the information bit may be encoded using the above-described gray codes so as to obtain a codeword, and the codeword is written into the memory cell of the memory.

An example of implementing the step S11 will be described below with reference to FIG. 4 to FIG. 8, and the concept of the comprehensive distribution (pattern set) proposed by the present disclosure and how to determine the comprehensive distribution of the current memory cell according to the influence of the adjacent memory cells on the distribution of the current memory cell will be introduced in detail.

Figure 4:
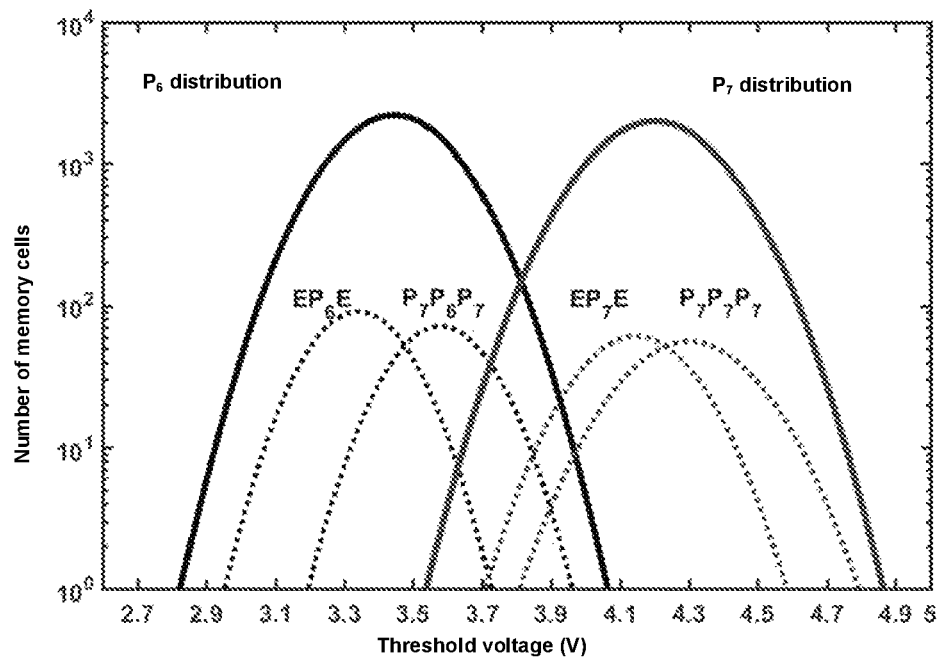
FIG. 4 shows a schematic diagram of considering an influence of adjacent memory cells on the same channel on a distribution of a current memory cell according to the embodiments of the present disclosure.
Figure 5:
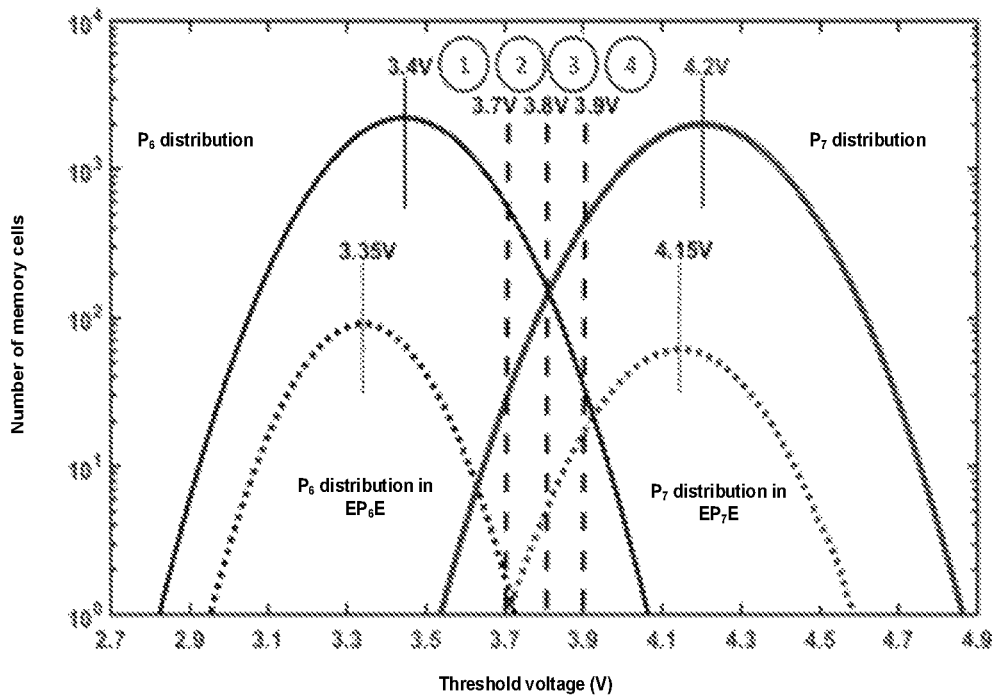
FIG. 5 shows a schematic diagram of determining a comprehensive distribution after considering of an influence of adjacent memory cells on the same channel on a distribution of a current memory cell according to the embodiments of the present disclosure.

FIG. 4 shows a schematic diagram of a consideration of an influence of adjacent memory cells on the same channel on a distribution of a current memory cell according to embodiments of the present disclosure. FIG. 5 shows a schematic diagram of determining a comprehensive distribution after consideration of an influence of adjacent memory cells on the same channel on a distribution of a current memory cell according to embodiments of the present disclosure.

Taking two distributions $P_6$ and $P_7$ of the TLC flash memory as an example, referring to FIG. 4, an existing reading and decoding method is to perform reading and decoding operations according to the method previously described with reference to FIG. 1 based on the $P_6$ distribution and the $P_7$ distribution indicated by solid lines in FIG. 4. In the present disclosure, considering that an E distribution corresponds to a low electron concentration, an electron concentration corresponding to each distribution may be different according to an ascending order E, $P_1$, $P_2$, $P_3$, $P_4$, $P_5$, $P_6$ and $P_7$ of a threshold voltage range corresponding to the distribution, herein an electron concentration corresponding to the $P_7$ distribution is higher than those of the $P_1$ distribution and the $P_2$ distribution. In this way, if a large difference exists in the electron concentration between corresponding adjacent memory cells on the same channel, a diffusion movement of electrons in the channel may be promoted, and the electrons may diffuse in a direction from a high concentration to a low concentration, so as to affect an actual distribution of a certain memory cell in the adjacent memory cells. Therefore, a current distribution of a certain memory cell may be affected by the distribution of the adjacent memory cells on the same channel as the memory cell, for example, a comprehensive distribution $EP_6E$ corresponding to a dashed line exemplarily illustrated in FIG. 4. The $EP_6E$ may also be represented as E-$P_6$-E. In a representation in a form of A-X-B or AXB, X represents a distribution of a certain memory cell on a current physical page, and A and B respectively represent distributions of memory cells located on upper and lower adjacent physical pages on the same channel as the above-mentioned memory cell. In the following description, A generally represents a distribution of the memory cell located on the lower adjacent physical page on the same channel as the above-mentioned memory cell, and B represents a distribution of the memory cell located on the upper adjacent physical page on the same channel as the above-mentioned memory cell.

Specifically, X represents a distribution of a certain memory cell on a current physical page; A represents a distribution of a first memory cell (which has the same x and y coordinates as and a different z coordinate from the above-mentioned memory cell) adjacent to the above-mentioned memory cell on a first physical page adjacent to the current physical page; and B represents a distribution of a second memory cell adjacent to the above-mentioned memory cell on a second physical page adjacent to the current physical page. Referring to FIG. 3, the current physical page is, for example, a middle physical page, the first physical page is, for example, a lower physical page, and the second physical page is, for example, an upper physical page. A certain memory on the current physical page has a coordinate of: (a, b, c), where a, b and c are all positive integers. When $c \geq 2$, the first memory cell has a coordinate of: (a, b, c−1), and the second memory cell has a coordinate of: (a, b, c+1). The $EP_6E$ exemplarily illustrates an expression form of the comprehensive distribution. Similarly, in a dotted distribution exemplarily illustrated in FIG. 4, for the distribution $P_6$ of the current memory cell, the comprehensive distribution may be determined to be $P_7P_6P_7$ or $EP_6E$ after considering the influence of the adjacent memory cells on the same channel on the distribution of the current memory cell. Similarly, for the distribution $P_7$ of the current memory cell, the comprehensive distribution may be determined to be $P_7P_7P_7$ or $EP_7E$ after considering the influence of the adjacent memory cells on the same channel on the distribution of the current memory cell. It should be noted that only $P_7$ and E are taken as examples in the above-mentioned examples, and actual distributions corresponding to the A and the B may be any one of E, $P_1$, $P_2$, $P_3$, $P_4$, $P_5$, $P_6$ and $P_7$.

Next, referring to FIG. 5, a threshold voltage at an overlap between the distribution $P_6$ and the distribution $P_7$ usually serves as a boundary, for example, a boundary at an overlap illustrated in 3.8V in FIG. 5. Another two boundaries may be obtained along a preset distance from the left and right of the boundary of 3.8V. Here, taking boundaries of 3.7V and 3.9V as examples respectively, the boundaries of 3.7V, 3.8V and 3.9V divide read data in a current view into four LLR regions (partitions) of ①, ②, ③, ④. In fact, the preset distance from the left and right of the boundary of 3.8V at the overlap may be adjusted according to actual needs.

When an LLR is configured or calculated in this embodiment, a comprehensive distribution corresponding to a dotted line is considered, rather than a distribution corresponding to a solid line is considered. In order to facilitate a distinct from the comprehensive distribution described in this paper, the distribution corresponding to the solid line considered in the prior art may be referred to as an initial distribution, and the initial distribution does not consider the influence of the adjacent memory cells on the same channel on the distribution of the current memory cell. Since the comprehensive distribution considers the influence of the adjacent memory cells on the same channel on the current memory cell distribution based on the lateral spreading effect, the LLR value configured based on the comprehensive distribution may reflect an actual distribution and a read data probability of the current memory cell more accurately and comprehensively.

A comparison between curves of the initial distribution and the comprehensive distribution in FIG. 5 shows that, in an exemplary illustrative example, a peak value (maximum number of memory cells) of an initial distribution $P_6$ has a corresponding threshold voltage of 3.4V, and a peak value (maximum number of memory cells) of an initial distribution $P_7$ has a corresponding threshold voltage of 4.2V. Comprehensive distributions (pattern sets) of the current memory cell may, for example, be determined to be $EP_6E$ and $EP_7E$ after considering the influence of the adjacent memory cells on the same channel on the distribution of the current memory cell. In FIG. 5, the comprehensive distribution $EP_6E$ is described by the $P_6$ distribution in $EP_6E$, and the comprehensive distribution $EP_7E$ is described by the $P_7$ distribution in $EP_7E$.

FIG. 5 shows that a peak value of the comprehensive distribution $EP_6E$ has a corresponding threshold voltage of 3.35V, and a peak value of the comprehensive distribution $EP_7E$ has a corresponding threshold voltage of 4.15V. The threshold voltages of 3.35V and 4.15V are different from the threshold voltages corresponding to the peak values of the initial distributions, so that a corresponding probability of calculating the LLR value in each partition is also different. In the embodiment illustrated in FIG. 5, Table 1 shows the LLR value in each partition obtained using the initial distribution in the prior art and the LLR value in each partition obtained using the comprehensive distribution of the present disclosure. In the prior art, symbols of the LLR values corresponding to the regions ①, ②, ③, ④ are respectively + + − −, while, by using the method of the embodiments of the present disclosure, symbols of the LLR values in the partitions ①, ②, ③, ④ obtained based on the comprehensive distribution are respectively: + − − −. A result obtained by the method of the present disclosure in the region ② is completely opposite to a result obtained by an existing method in the region ②. After an experimental verification, the method of the present disclosure may effectively reduce a bit error rate and improve an error correction capability of a device.

TABLE 1

Comparison of LLR values in each partition obtained using the initial distribution and the comprehensive distribution

| Partition (region) | ① | ② | ③ | ④ |
|---|---|---|---|---|
| LLR value obtained by the existing method | 8.64 | 3.91 | −2.44 | −11.53 |
| LLR value obtained by the method of the present disclosure | 6.17 | −3.32 | −20 (−Inf) | −20 (−Inf) |

Beneficial effects of the decoding process based on the LLR values configured by the comprehensive distribution will be described in conjunction with experimental results illustrated in FIG. 9 and FIG. 10.

Figure 9:
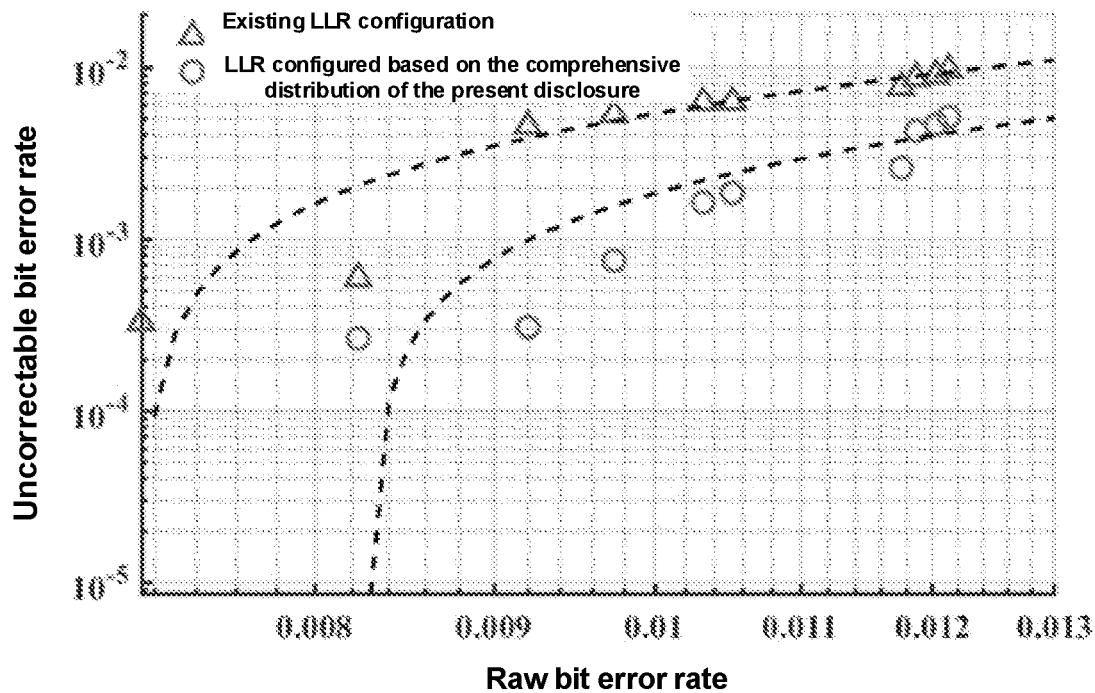
FIG. 9 shows a comparison diagram of error correction capabilities between a method for performing an LDPC soft decoding and an existing decoding method according to embodiments of the present disclosure.
Figure 10:
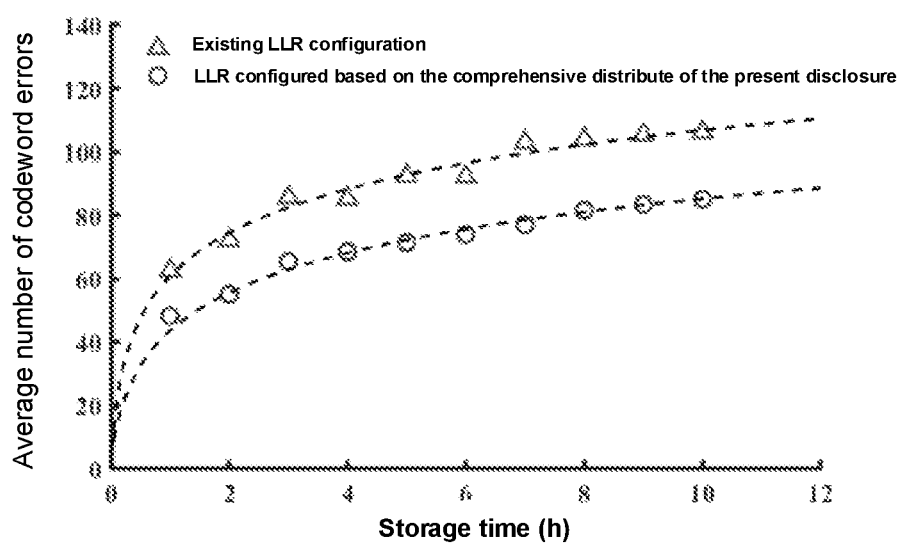
FIG. 10 shows a comparison diagram of bit error rates between a method for performing an LDPC soft decoding and an existing decoding method according to embodiments of the present disclosure.

FIG. 9 shows a comparison diagram of error correction capabilities between a method for performing an LDPC soft decoding and an existing decoding method according to embodiments of the present disclosure. FIG. 10 shows a comparison diagram of bit error rates between a method for performing an LDPC soft decoding and an existing decoding method according to embodiments of the present disclosure.

The same memory cell are provided with 8 distributions, and an error easily occurs at an overlapping portion of adjacent distributions. If the result of decoding the LLR value in the region ② obtained by the existing method as illustrated in Table 1 has an error, the result of decoding the LLR value obtained based on the comprehensive distribution proposed by the embodiments of the present disclosure may achieve an effect of error correction. In FIG. 9, the abscissa represents a raw bit error rate (RBER), and the ordinate represents an uncorrectable bit error rate (LIBER). In FIG. 10, the abscissa represents storage time, and the ordinate represents an average number of codeword errors. Referring to FIG. 9 and FIG. 10, the method for performing an LDPC soft decoding of the present disclosure may effectively reduce an RBER and effectively improve an error correction capability compared to the existing method.

In an embodiment of the present disclosure, the comprehensive distribution of the flash memory is divided into three types: an overall left type, an overall centering type and an overall right type, which will be described in detail below with reference to FIG. 7.

FIG. 7 shows a schematic diagram exemplarily illustrating a division of a comprehensive distribution of a memory unit into three types according to embodiments of the present disclosure.

In this embodiment, taking the TLC flash memory as an example, referring to FIG. 3 and FIG. 7, for a memory cell on a certain current physical page, a distribution of a memory cell located on the same channel as the above-mentioned memory cell on a physical page adjacent to the certain physical page may affect the distribution of the memory cell on the current physical page. Therefore, threshold voltage distributions of memory cells on three levels of physical pages may be obtained sequentially by a method of reading the word-lines from the bottom to the top, for example, threshold voltage distributions of memory cells on a physical page 1, a physical page 2 and a physical page 3 may be sequentially obtained. A comprehensive distribution of the memory cell on the physical page 2, which corresponds to a middle-level physical page, may be determined according to the obtained threshold voltage distributions of the memory cells on the three levels of physical pages.

Taking a TLC as an example, the comprehensive distribution determined based on the above-mentioned method may be divided into three types: an overall left type, an overall centering type and an overall right type. The overall left type is: low/medium-X-low, in which LLRs are positive in the region ① and negative in the regions ②, ③ and ④. The overall right type is: low/medium/high-X-high, medium/high-X-medium, in which the LLRs are positive in regions ①, ② and ③ and negative in region ④. Situations in remaining forms are of the overall centering type in which the LLRs are both positive in regions ① and ② and negative in regions ③ and ④. The "/" in this paragraph indicates a meaning of "or". A low correspondence distribution is: E, $P_1$, $P_2$; a medium correspondence distribution is: $P_3$, $P_4$; and a high correspondence distribution is: $P_5$, $P_6$, $P_7$. According to the method of reading word-lines WLs from bottom to top, a corresponding relationship is as follows: low (0-2), medium (3-4) and high (5-7), where numbers in the brackets represent positions of the word-lines on a z-axis, and 0 represents that the word-lines are read from the lowest memory cell array. For example, for the initial distributions $P_6$ and $P_7$ illustrated in FIG. 7, $EP_EE$ and $EP_7E$ in the comprehensive distributions obtained based on the lateral spreading effect are of overall left type, and the comprehensive distributions $P_4P_6P_4$, $P_7P_6P_7$, $P_4P_7P_4$ and $P_7P_7P_7$ are of overall right type. Exemplarily, the comprehensive distribution corresponding to the overall centering type may be in the form of: $P_7P_6E$, $P_7P_7E$. Certainly, X is exemplified by $P_6$ and $P_7$, and may actually be any one of the distributions E, $P_1$, $P_2$, $P_3$, $P_4$, $P_5$, $P_6$ and $P_7$.

Experiments prove that, for the 3D NAND flash memory, an influence of a memory cell on the upper physical page on the distribution of the current memory cell is greater than that of a memory cell on the lower physical page on the distribution of the current memory cell. Therefore, in an embodiment, only two levels of physical pages may be selected for a reading operation, and a physical page at a low level (the sequence number of word line is small) is a physical page where the current memory cell is located, and a physical page at a high level is a physical page where the memory cell adjacent to the current memory cell is located, so that a higher reading accuracy may be achieved with the minimum reading cost.

In an embodiment of the present disclosure, the memory is a 3D NAND flash memory, the current memory cell has a corresponding coordinate of (m, n, k), k≥1, and the memory cell adjacent to the current memory cell is selected by: sequentially selecting, upwardly and/or downwardly along a z-axis, a plurality of memory cells having a preset distance from the current memory cell.

For example, for the 3D NAND flash memory, in a process of determining the comprehensive distribution, the above-mentioned method is not limited to selecting the number of levels, a selection direction and a distance of the physical pages, for example, at least 2 levels of physical pages may be selected. The current memory cell has a corresponding coordinate of (m, n, 1), and when the comprehensive distribution is calculated, a memory cell having a corresponding coordinate of (m, n, 2) may be selected, or two or more memory cells having corresponding coordinates of (m, n, 2) and (m, n, 3) may also be selected.

In another example, the current memory cell has a corresponding coordinate of (m, n, 5), and when the comprehensive distribution is calculated, different distances may be selected as adjacent memory cells in a single direction, for example, a memory cell having a corresponding coordinate of (m, n, 6) may be selected, or two memory cells having corresponding coordinates of (m, n, 6) and (m, n, 7) may be selected, Certainly, the different distances may be selected in an opposite direction, for example, a memory cell having a corresponding coordinate of (m, n, 4) may be selected.

In addition, respective distances may be selected in a plurality of directions, for example, (m, n, 4) and (m, n, 6) may be selected; or (m, n, 3), (m, n, 4) and (m, n, 6) may be selected; or (m, n, 4), (m, n, 6) and (m, n, 7) may be selected; or (m, n, 3), (m, n, 4), (m, n, 6) and (m, n, 7) may be selected.

The above-mentioned embodiments have been described with reference to the structure corresponding to the 3D NAND flash memory. It should be noted that the selection direction, the selection distance and the like of the memory cell adjacent to the current memory cell corresponding to structures of other memories may be comprehensively considered according to structural features, a distribution influence, and a selection cost of the memory.

An operation process of the method for performing an LDPC soft decoding of the present disclosure will be described below with reference to FIG. 8. In the following description, the upper physical page is taken as an exemplary description, and the middle physical page and the lower physical page are performed in the same way as the upper physical page does.

Figure 8:
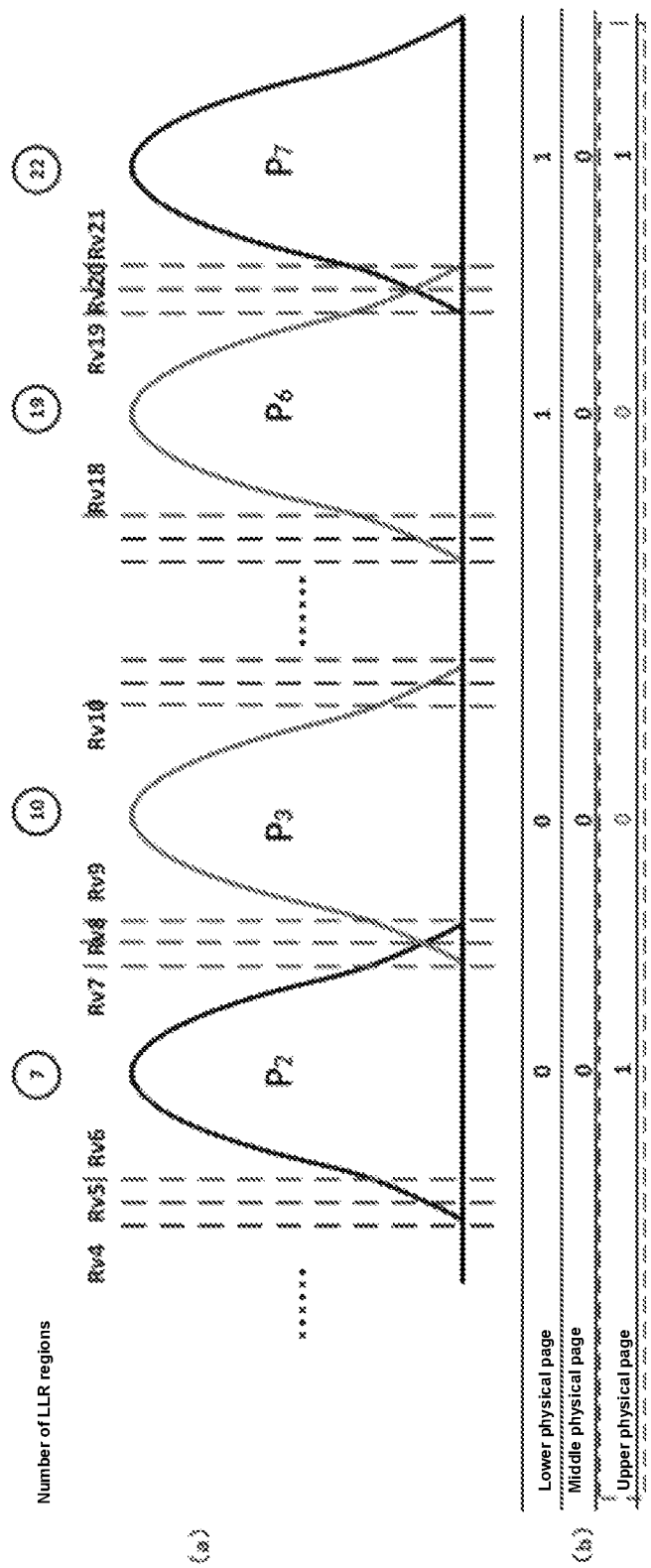
FIG. 8 shows a schematic diagram of a region division by a TLC flash memory according to the embodiments of the present disclosure, where (a) shows a divided LLR region, and (b) s shows a binary gray code corresponding to each LLR region on three levels of adjacent physical pages.

FIG. 8 shows a schematic diagram illustrating a region division by a TLC flash memory according to embodiments of the present disclosure, where (a) shows a divided LLR region, and (b) shows a binary gray code corresponding to each LLR region on three levels of adjacent physical pages.

The partition is set in the method described above. A corresponding threshold voltage at an overlap of adjacent distributions serves as a boundary, and threshold voltages along a preset distance from the left and right of the boundary at the overlap are selected as two adjacent boundaries. (a) of FIG. 8 selectively illustrates multi-group boundaries of: Rv4, Rv5, Rv6, Rv7, Rv8, Rv9, Rv19, Rv20 and Rv21. For the TLC, 8 distributions are provided in total, 7 overlapping boundaries are generated, and 3 boundaries are actually generated for each overlapping boundary, and thus 21 boundaries are generated in total. In this way, the TLC is divided into 22 regions, that is, 22 LLR partitions are acquired. Situations of LLR partitions may be shown in (a) of FIG. 8. In order to exemplify with an overall situation of an upper physical page partition, an illustration of partial distributions is omitted, and the illustration is only performed by $P_2$, $P_3$, $P_6$ and $P_7$. Similarly, (b) of FIG. 8 correspondingly illustrates binary gray codes of partial distributions shown in different physical pages. For an encoding method of setting a gray code corresponding to each distribution on different physical pages, please refer to the description related to FIG. 6, which will not be repeated here.

As shown in FIG. 6 and (b) of FIG. 8, in the upper physical page, the gray codes corresponding to the 8 distributions of E, $P_1$, $P_2$, $P_3$, $P_4$, $P_5$, $P_6$, $P_7$ are sequentially: 1 1 1 0 0 0 0 1. In this way, the read data may be divided into three large regions according to the gray codes: E to P2, P3 to P6 and P7. Taking Rv7, Rv8, Rv9, Rv19, Rv20, Rv21 and additional Rv6, Rv10 and Rv18 as inner boundaries of a large region, subdivided 1+4+1+4=10 small LLR regions may be acquired. LLR values of the regions 11 to 18 are set to be 10, and LLR values of the regions 1 to 6 are set to be −10. For small regions 7 to 10 (illustrated by ⑦ to ⑩ in (b) of FIG. 8) and small regions 19 to 22 (which are equal to ⑲ and ㉒), LLR values are set in each small region according to the comprehensive distribution. In the process, the LLR values may be configured according to test data of an actual flash memory.

After respective LLR values are set in the respective partitions (small regions) 7 to 10 and 19 to 22 according to the comprehensive distribution, LLR values under different storage time, different threshold voltage partitions and comprehensive distributions may be established so as to obtain an LLR table. In the LLR table, an input includes: a storage time, a threshold voltage partition and a comprehensive distribution, and an output includes an LLR value.

The above-mentioned process describes a specific implementation process of determining the comprehensive distribution of the current memory cell according to the influence of the adjacent memory cells on the same channel on the distribution of the current memory cell in the TLC flash memory, and correspondingly establishing LLR values under different storage time, threshold voltage partitions and comprehensive distributions, i.e., a process of implementing the step S11. The step S11 may be pre-performed. In a subsequent decoding process, it is not necessary to establish an LLR table for each decoding operation. A pre-established LLR table may be stored in the memory and may be directly called in the subsequent decoding process.

The step S12 is performed, in which an information bit is encoded so as to obtain a codeword and the codeword is written into the memory cell of the memory.

The step S13 is performed, in which a partition attribution of the memory cell on the upper physical page is read out using threshold voltages corresponding to Rv6, Rv7, Rv8, Rv9, Rv10, Rv18, Rv19, Rv20 and Rv21, and the LLR table is queried according to the storage time, the partition and the comprehensive distribution, and a corresponding LLR value is assigned to the upper physical page.

The step S14 is performed, in which a soft decoding operation is performed on an LLR of a codeword on the upper physical page.

In summary, this embodiment discloses a method for performing an LDPC soft decoding. In consideration of a presence of the lateral spreading effect in the memory cell array, since the memory uses a design of a shared charge storage space, information stored in the adjacent memory cells may have a great influence on a storage performance of the current memory cell. After the region is divided based on an overlap of the initial distributions, an LLR value may be determined in each region according to the comprehensive distribution considering the influence of the distribution of the adjacent memory cells. Compared with an existing method for performing an LDPC soft decoding, the method for performing a soft decoding operation on the LLR value determined by the comprehensive distribution may reduce a bit error rate, improve an error correction capability and reduce the number of times of iterations at the same time.

In a second exemplary embodiment of the present disclosure, there is provided a memory for performing the above-mentioned method for performing an LDPC soft decoding, and in particular a non-volatile memory which may be a 2D or 3D flash memory, such as a 3D NAND flash memory.

It should be noted that, the effect is not limited to the lateral spreading effect or the capacitive coupling effect or the like mentioned in the above-mentioned embodiment, and the memory is within the scope of protection of the present disclosure as long as an influence or interference effect of the memory cell on the current memory cell distribution exists in a surrounding environment.

In an embodiment, the memory may be a computer-readable storage medium which may be any tangible medium containing or storing a program. The program may be used by or in conjunction with an instruction execution system, apparatus, or device.

The memory of this embodiment, as an implementation object of the above-mentioned soft decoding method, may perform operations of the step S11, step S13 and step S14 on the memory. The step S11 only needs to be pre-executed once, and does not need to be executed every time the decoding operation is performed. In addition, the step S12 may be performed before the step S13. In another embodiment, the step S11 of pre-establishing the LLR table may be pre-executed on a memory, and an established LLR is stored in a memory module. The memory module may be located on the memory, or may be located in other storage devices or servers other than the memory. Each time the step S12, step S13 and step S14 are executed on the memory, the LLR table may be directly recalled from the memory module in the step S13.

The memory of this embodiment is a 3D NAND flash memory. When a decoding operation is performed, the LLR is configured by using the comprehensive distribution, and the influence of the adjacent memory cells on the same channel on the distribution of the current memory cell is considered, which may reduce a bit error rate, improve an error correction capability and reduce the number of times of iterations.

In a third exemplary embodiment of the present disclosure, there is provided an electronic device for implementing the above-mentioned method for performing an LDPC soft decoding. The electronic device of this embodiment serves as an application object of the above-described method.

Figure 11:
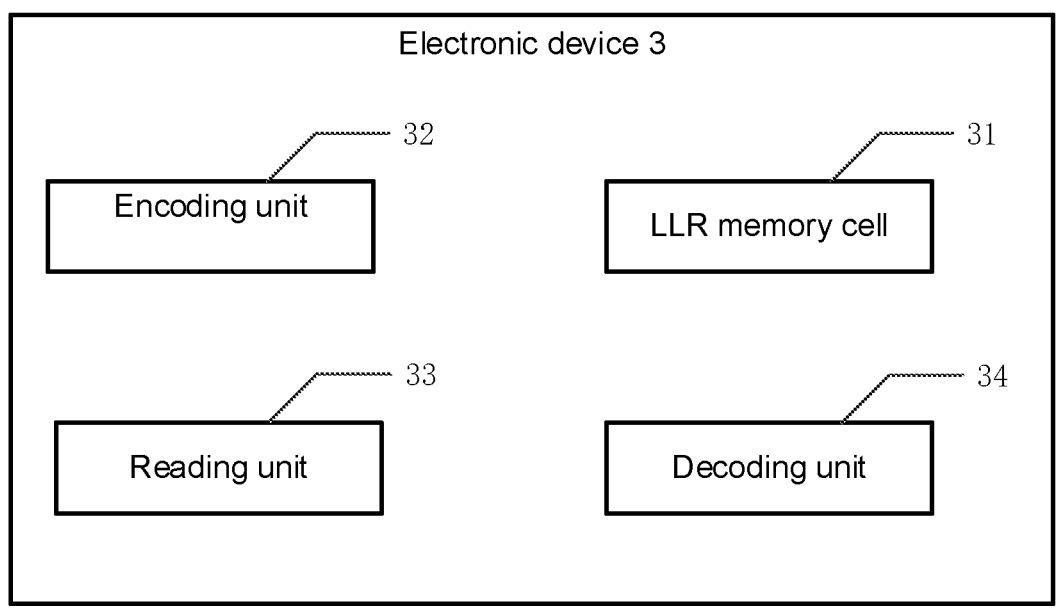
FIG. 11 shows a block diagram of an electronic device according to another embodiment of the present disclosure.

FIG. 11 shows a block diagram of an electronic device according to another embodiment of the present disclosure.

Referring to FIG. 11, an electronic device 3 of this embodiment includes: an LLR memory cell 31, an encoding unit 32, a reading unit 33 and a decoding unit 34.

The LLR memory cell 31 is configured to store a pre-established LLR table, wherein an input of the LLR table includes: a storage time, a threshold voltage partition and a comprehensive distribution, and an output of the LLR table includes an LLR value; wherein the comprehensive distribution of a current memory cell is determined according to an influence of a memory cell adjacent to the current memory cell on a distribution of the current memory cell.

The encoding unit 32 is configured to encode an information bit to obtain a codeword and write the codeword into a memory cell of a memory.

The reading unit 33 is configured to read the memory cell having a encoded information bit, and extract the pre-established LLR table from the LLR memory cell, so as to obtain an LLR value of the current memory cell according to the storage time, the threshold voltage partition and the comprehensive distribution corresponding to the current memory cell during reading.

The decoding unit 34 is configured to perform a soft decoding operation on the codeword in the memory cell having the encoded information bit according to the read LLR value of the current memory unit.

In the embodiments of the present disclosure, the electronic device 3 includes: a computer, a mobile phone, a smart sound, a wearable smart device, a robot, a smart chip and the like.

In an embodiment, the electronic device and the above-mentioned memory that performs encoding and decoding operations may be two independent individuals, for example, the electronic device may be a computer and the above-mentioned memory may be a USB flash disk. Alternatively, the above-mentioned memory may be a component of the electronic device, for example, the electronic device is a computer, and the memory is a NAND flash memory chip inside the computer. Correspondingly, the LLR memory cell 31 may be a memory cell in the memory that performs encoding and decoding operations, or may be a hardware or a combination of hardware and software with a storage function located in other storage devices other than the memory. For example, when the electronic device and the memory are two independent individuals, the LLR memory unit 31 may be located in the above-mentioned memory, or located in the above-mentioned electronic device, or located in a server that may be in communication with the execution main body (the electronic device and/or the memory). The LLR memory unit 31 may be called when needed.

A method flow according to the embodiments of the present disclosure may be implemented as a computer software program. The encoding unit 32, the reading unit 33 and the decoding unit 34 may be computer program instructions. For example, the embodiments of the present disclosure include a computer program product including a computer program embodied on a computer-readable storage medium, and the computer program contains a program code for performing the method illustrated in the flowchart.

In summary, the present disclosure provides a method for performing an LDPC soft decoding, a memory and an electronic device. In consideration of a presence of the lateral spreading effect in a memory cell array, since the memory uses a design of a shared charge storage space, information stored in the adjacent memory cells may have a great influence on a storage performance of the current memory cell. After the region is divided based on an overlap of the initial distributions, an LLR value may be determined in each region according to the comprehensive distribution considering the influence of the distribution of the adjacent memory cells. Compared with an existing method for performing an LDPC soft decoding, the method for performing a soft decoding operation on the LLR value determined by the comprehensive distribution may reduce a bit error rate, improve an error correction capability and reduce the number of times of iterations at the same time.

In the embodiments of the present disclosure, each block in block diagrams or flowcharts and a combination of the blocks in the block diagrams or flowcharts may be implemented by a dedicated-purpose hardware-based system that may perform specified functions or operations, or by a combination of a dedicated-purpose hardware and a computer instruction.

Use of "first," "second" and similar words in the present disclosure is not intended to indicate any order, quantity or importance, but is merely used to distinguish one element from another. The order of execution exemplarily described in the flowcharts and the embodiments is not unique, and other logical orders of execution are within the scope of protection of the present disclosure.

The above-mentioned specific embodiments have further described the objects, technical solutions and advantages of the present disclosure in detail. It should be understood that these descriptions are merely specific embodiments of the present disclosure and are not intended to limit the present disclosure. In addition, any modifications, equivalents, improvements and the like made within the spirit and principle of the present disclosure all fall within the scope of protection of the present disclosure.

What is claimed is:

1. A method for performing a low density parity check (LDPC) soft decoding, using for a memory comprising a plurality of memory cells, and the method comprising:
   reading a memory cell having an encoded information bit, so as to obtain a log likelihood ration (LLR) value of a current memory cell with reference to a pre-established LLR table according to a storage time, a threshold voltage partition and a comprehensive distribution corresponding to the current memory cell during reading; and
   performing a soft decoding operation on a codeword in the memory cell having the encoded information bit according to the read LLR value of the current memory cell;
   wherein the comprehensive distribution of the current memory cell is determined according to an influence of a memory cell adjacent to the current memory cell on a distribution of the current memory cell; an input of the pre-established LLR table comprises the storage time, the threshold voltage partition and the comprehensive distribution, and an output of the pre-established LLR table comprises the LLR value;
   wherein the LLR table is pre-established by:
   performing a reading test on the memory, acquiring respective threshold voltage partitions and distributions of a current memory cell having a known accurate encoding and a memory cell adjacent to the current memory cell at a certain memory time, determining a comprehensive distribution of the current memory cell according to an influence of the memory cell adjacent to the current memory cell on a distribution of the current memory cell, and calculating LLR values for different threshold voltage partitions according to the comprehensive distribution, wherein the influence comprises a lateral spreading effect or a capacitive coupling effect; and
   acquiring corresponding threshold voltage partitions and comprehensive distributions under different storage time, so as to obtain the LLR table with the storage time, the threshold voltage partition and the comprehensive distribution as the input and the LLR value as the output.

2. The method of claim 1, further comprising:
   before the reading a memory cell having an encoded information bit,
   encoding the information bit to obtain the codeword and writing the codeword into the memory cell of the memory.

3. The method of claim 1, wherein the memory is a 3D NAND flash memory and the memory cell adjacent to the current memory cell is selected by:
   selecting, upwardly and/or downwardly along a z-axis, a plurality of memory cells with a preset distance from the current memory cell.

4. The method of claim 1, wherein at least two adjacent physical pages comprising a physical page where the current memory cell is located are read in response to determining the comprehensive distribution of the current memory cell.

5. The method of claim 1, wherein only two levels of physical pages are selected for a read operation in response to determining the comprehensive distribution of the current memory cell, wherein a physical page at a low level is a physical page where the current memory cell is located, and a physical page at a high level is a physical page where the memory cell adjacent to the current memory cell is located, and the comprehensive distribution of the current memory cell is determined by reading a distribution of the memory cell on the two levels of physical pages.

6. The method of claim 1, wherein the input of the LLR table further comprises: a number of erasing times.

7. A memory, comprising a plurality of memory cells, wherein the memory is configured to perform the method of claim 1.

8. The memory of claim 7, wherein the memory comprises a flash memory.

9. An electronic device, comprising:
- an encoding unit configured to encode an information bit to obtain a codeword and write the codeword into a memory cell of a memory;
- a log likelihood ratio LLR memory cell configured to store a pre-established LLR table, wherein an input of the LLR table comprises:
- a storage time, a threshold voltage partition and a comprehensive distribution, and an output of the LLR table comprises an LLR value; wherein the comprehensive distribution of a current memory cell is determined according to an influence of a memory cell adjacent to the current memory cell on a distribution of the current memory cell;
- a reading unit configured to read the memory cell having an encoded information bit, and extract the pre-established LLR table from the LLR memory cell, so as to obtain an LLR value of the current memory cell according to the storage time, the threshold voltage partition and the comprehensive distribution corresponding to the current memory cell during reading; and
- a decoding unit configured to perform a soft decoding operation on the codeword in the memory cell having the encoded information bit according to the read LLR value of the current memory unit;

wherein the LLR table is pre-established by:
- performing a reading test on the memory, acquiring respective threshold voltage partitions and distributions of a current memory cell having a known accurate encoding and a memory cell adjacent to the current memory cell at a certain memory time, determining a comprehensive distribution of the current memory cell according to an influence of the memory cell adjacent to the current memory cell on a distribution of the current memory cell, and calculating LLR values for different threshold voltage partitions according to the comprehensive distribution, wherein the influence comprises a lateral spreading effect or a capacitive coupling effect; and
- acquiring corresponding threshold voltage partitions and comprehensive distributions under different storage time, so as to obtain the LLR table with the storage time, the threshold voltage partition and the comprehensive distribution as the input and the LLR value as the output.

10. The electronic device of claim 9, wherein the electronic device comprises: a computer, a mobile phone, a smart sound, a wearable smart device and a robot.

11. The electronic device of claim 9, wherein the electronic device and a memory with data writing and decoding are two independent individuals; or the memory with data writing and decoding serves a component of the electronic device.

12. The electronic device of claim 9, wherein the LLR memory cell is located within the memory, within the electronic device, or on a server.

13. The electronic device of claim 9, wherein the input in the LLR table further comprises: a number of erasing times.

* * * * *